United States Patent [19]

Nakayama

[11] Patent Number: 5,396,105

[45] Date of Patent: Mar. 7, 1995

[54] SEMICONDUCTOR DEVICE

[75] Inventor: Takeo Nakayama, Kawasaki, Japan

[73] Assignee: Kabushiki Kaisha Toshiba, Tokyo, Japan

[21] Appl. No.: 941,325

[22] Filed: Sep. 4, 1992

[30] Foreign Application Priority Data

Sep. 6, 1991 [JP] Japan ................... 3-226848

[51] Int. Cl.$^6$ ............... H01L 27/02; H01L 23/48; H01L 29/04; G11C 11/00
[52] U.S. Cl. .................. 257/385; 257/413; 257/904; 365/154
[58] Field of Search ............... 257/381, 385, 393, 413, 257/903, 904; 365/154, 182

[56] References Cited

U.S. PATENT DOCUMENTS

| 4,910,576 | 3/1990 | Campbell et al. | 257/393 |
| 4,951,112 | 8/1990 | Choi et al. | 357/41 |
| 5,162,889 | 11/1992 | Itomi | 257/903 |

FOREIGN PATENT DOCUMENTS

| 0032608 | 7/1981 | European Pat. Off. |
| 0320405 | 6/1989 | European Pat. Off. |

Primary Examiner—Mark V. Prenty
Attorney, Agent, or Firm—Finnegan, Henderson, Farabow, Garrett & Dunner

[57] ABSTRACT

A MOSFET constituting a flip-flop circuit and a MOSFET for control of reading and writing data out of and into a memory cell are formed on a semiconductor. The gate electrode of the first MOSFET and the gate electrode of the second MOSFET are formed by layers of different levels. The gate electrodes have an overlapped portion R. The first and second MOSFETs are arranged symmetrically with respect to a certain point P. By virtue of the above structure, the degree of integration of a static RAM is enhanced.

9 Claims, 5 Drawing Sheets

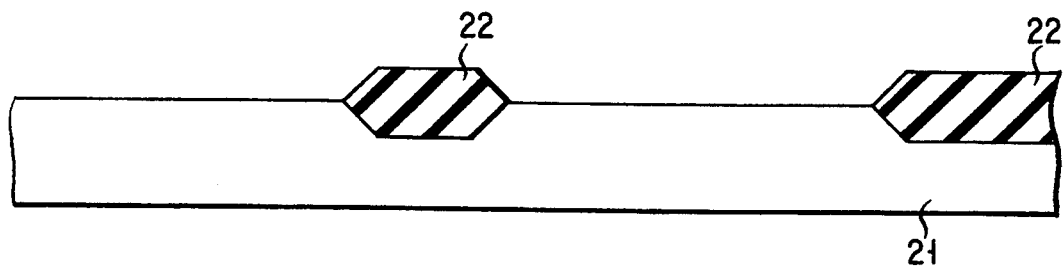
F I G. 4A
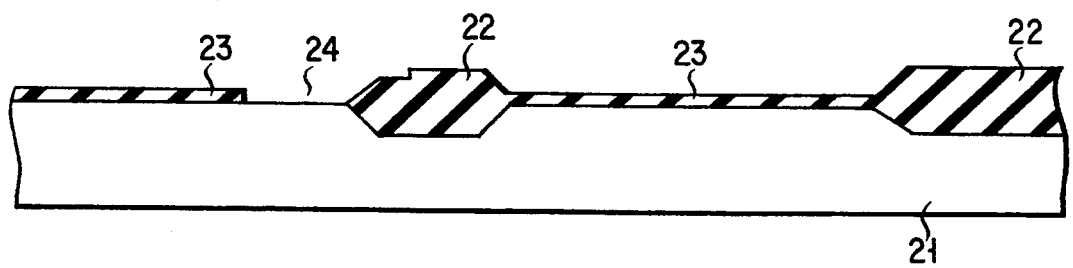
F I G. 4B
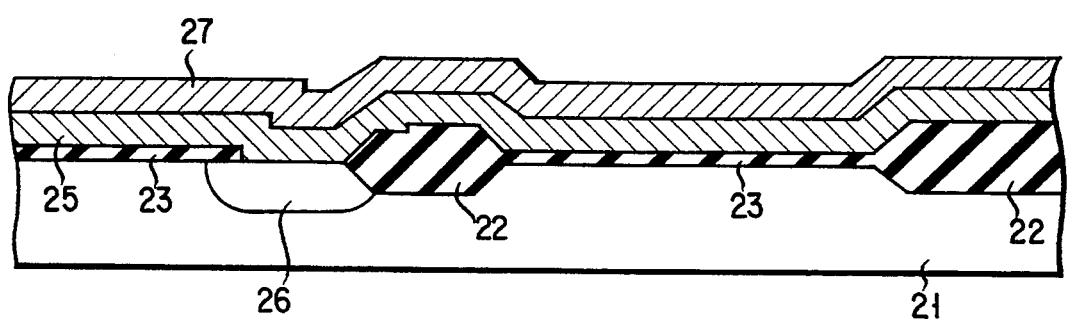
F I G. 4C
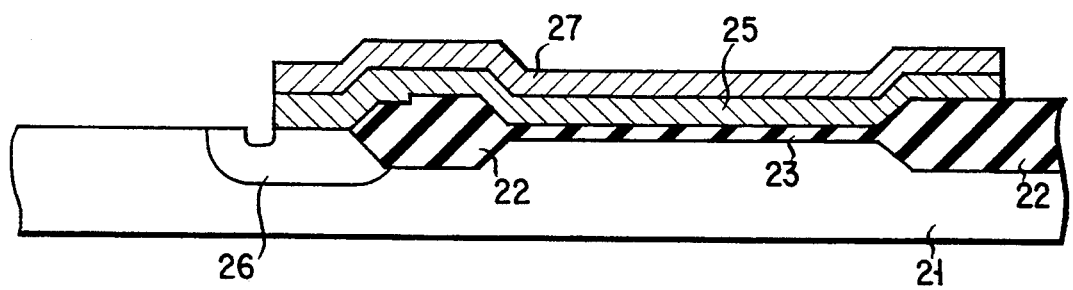
F I G. 4D

SEMICONDUCTOR DEVICE

BACKGROUND OF THE INVENTION

1. Field of the Invention

This invention relates to an improved flip-flop circuit used as a memory cell in a static RAM.

2. Description of the Related Art

A conventional flip-flop circuit used as a memory cell in a static RAM has a structure as shown in FIG. 1. In FIG. 1, reference numeral 1 denotes a MOSFET constituting the flip-flop circuit, reference numeral 2 a MOSFET for control of reading data out of the memory cell and of writing data into the same, reference numeral 3 a load resistor, reference numeral 4 a word line, and reference numeral 5 a bit line.

The static RAM has a pattern as shown in FIG. 2, and is formed on a semiconductor substrate. In FIG. 2, reference numeral 6 designates an element region in which the MOSFETs 1 and 2 are formed, reference numeral 7 the gate electrode of the MOSFET 1, and reference numeral 8 the gate electrode of the MOSFET 2.

In the pattern of FIG. 2, the gate electrode 7 of the MOSFET 1 and the gate electrode 8 of the MOSFET 2 are formed by films of the same level. In other words, the gate electrodes 7 and 8 are simultaneously formed by patterning a single silicon layer. Thus, separation regions S must be formed between the electrodes 7 and 8 to separate them from each other. This is disadvantageous to increase the degree of integration of elements.

Further, in the above pattern, the gate oxide films of the MOSFETs 1 and 2 are formed simultaneously. That is, the gate oxide films have the same thicknesses. Accordingly, the ratio of the driving force of the MOSFET 1 to that of the MOSFET 2 is determined mainly by the channel lengths and widths of the MOSFETs. To increase the ratio of the driving force, the channel width of the MOSFET 1 must be larger than that of the MOSFET 2. Therefore, the ratio of the area of the MOSFET 1 to the overall area of the substrate surface must be large, which is disadvantageous to high integration.

SUMMARY OF THE INVENTION

It is the object of the invention to enhance the degree of integration of a static RAM by devising the locations of the gate electrodes of a MOSFET constituting a flip-flop circuit and of a control MOSFET.

To attain the above object, the semiconductor device of the invention has a flip-flop circuit used as a memory cell in a static RAM, and a transfer gate for control of reading and writing data out of and into the memory cell, respectively. The flip-flop circuit includes a first MOSFET. The gate electrode of the first MOSFET is formed by a layer of a first level. The transfer gate includes a second MOSFET. The gate electrode of the second MOSFET is formed by a layer of a second level different from the first level. As can be viewed from the surface of a substrate on which the semiconductor device is formed, the gate electrodes of the first and second MOSFETs are overlapped with each other.

Further, the gate insulating film of the first MOSFET has a thickness different from that of the second MOSFET, and the ratio of the effective gate capacity of the first MOSFET to that of the second MOSFET is determined by the ratio of the thickness of the gate insulating film of the first MOSFET to that of the gate insulating film of the second MOSFET.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4G are views, useful in explaining how the semiconductor device of FIG. 3 is produced.

DETAILED DESCRIPTION OF THE PREFERRED EMBODIMENT

An embodiment of the invention will be explained with reference to the accompanying drawings.

Figure 1:
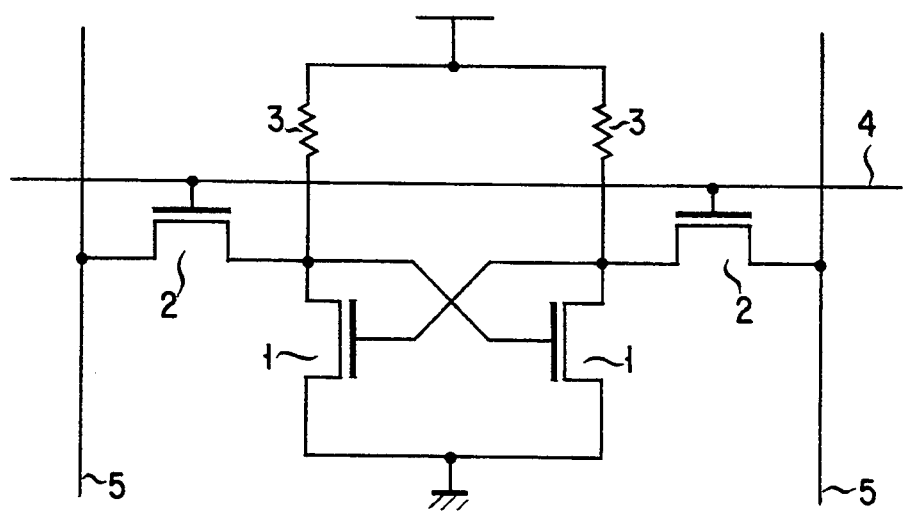
FIG. 1 is a circuit diagram showing a memory cell in a static RAM.
Figure 2:
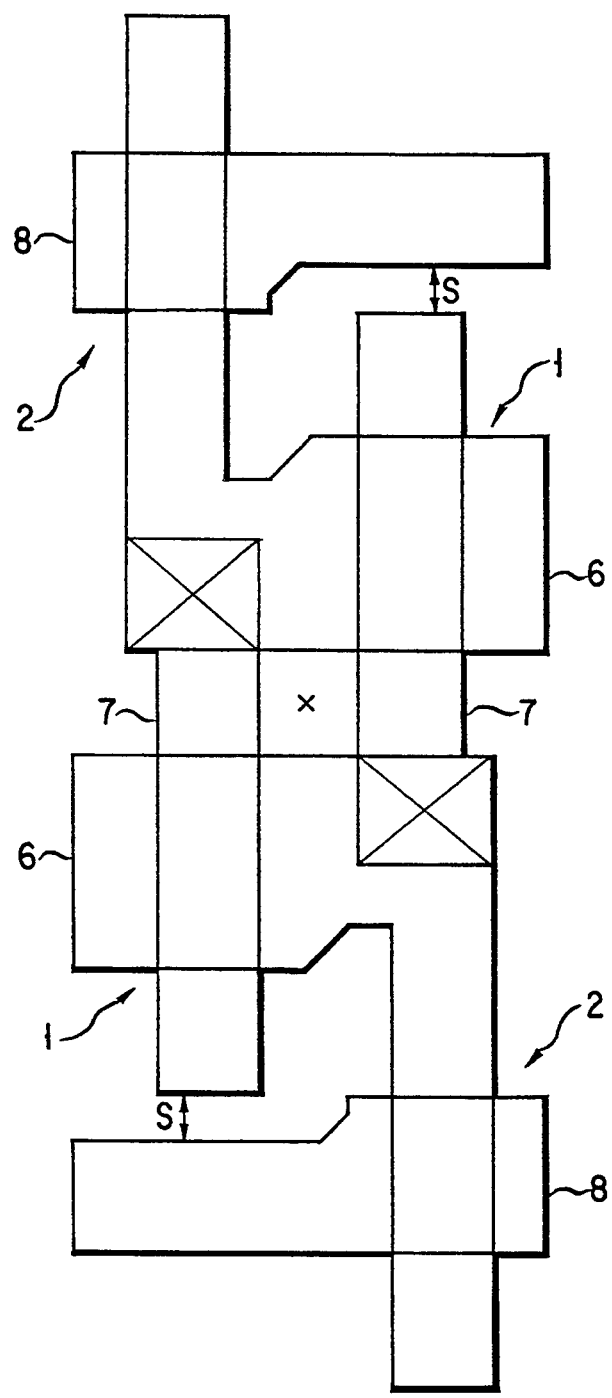
FIG. 2 is a plan view showing a conventional semiconductor device.
Figure 3:
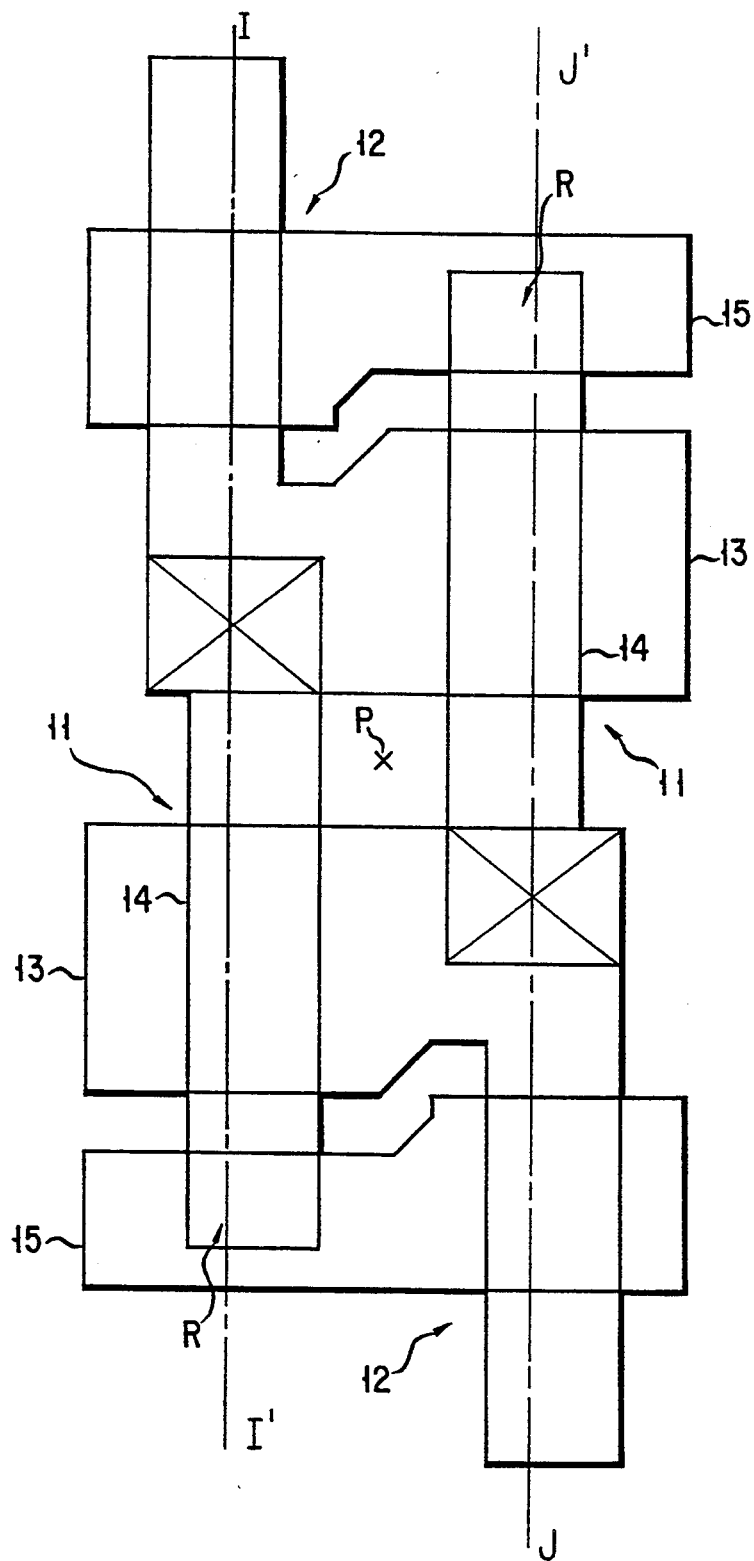
FIG. 3 is a plan view showing a semiconductor device according to the invention.

FIG. 3 shows a semiconductor device according to an embodiment of the invention. In FIG. 3, reference numeral 11 designates a MOSFET constituting the flip-flop circuit, reference numeral 12 a MOSFET for control of reading data out of a memory cell and of writing data into the same, reference numeral 13 an element region, reference numeral 14 the gate electrode of the MOSFET 11, and reference numeral 5 the gate electrode of the MOSFET 12.

The semiconductor device of the invention is characterized in that the gate electrodes 14 and 15 are formed by films of different levels. That is, as is indicated by regions R in FIG. 3, the electrodes 14 and 15 are overlapped with each other. Thus, the invention does not need such a separation region as is employed in the conventional device.

Further, as will be referred to in a manufacturing process explained later, the gate insulation films of the MOSFETs 11 and 12 can have different thicknesses, and hence the ratio of the driving force can be adjusted also by the gate insulation films.

If the MOSFETs 11 and 12 are located symmetrically with respect to a point P, the symmetry of the flip-flop circuit is enhanced, and the degree of integration of the static RAM be increased.

FIGS. 4A to 4G are cross sectional views, showing steps in a method of manufacturing the semiconductor device of the invention, and taken along line I—I' or line J—J' of FIG. 3 through the steps.

First, as is shown in FIG. 4A, a silicon oxide film (SiO$_2$) having a thickness of about 500Å is formed on a p-type silicon monocrystal substrate 21 by hydrogen burning oxidation at a temperature of 950° C. A silicon nitride film (SiN) having a thickness of about 1500Å is formed on the silicon oxide film. Then, a resist film is formed on the silicon nitride film by lithography, and part of the silicon nitride film is etched by chemical vapor isotropic etching. Thereafter, an element-separating oxide film (SiO$_2$) 22 having a thickness of about 8000Å is formed by hydrogen burning oxidation at a temperature of 1000° C in those regions of the substrate 21 in which the silicon nitride film is not formed. As a result, element regions and separation regions are formed in the substrate 21.

Then, as is shown in FIG. 4B, the silicon nitride film is completely removed by chemical vapor isotropic etching. Further, those portions of the silicon oxide film which are formed in the element regions are removed using NH$_4$F solution. Thereafter, a silicon oxide film (SiO$_2$) 23 having a thickness of about 160Å is formed on the substrate 21 by dry oxygen oxidation at a temperature of 900° C. Part of the silicon oxide film 23 is etched using lithography and NH$_4$F solution, thereby forming a contact hole 24.

As is shown in FIG. 4C, a polysilicon film 25 having a thickness of about 2000Å is formed on the entire surface of the substrate 21 by chemical vapor deposition. Then, the resultant is subjected to heat treatment for 30 minutes in the atmosphere of POCl$_3$ of 900° C. As a result, the polysilicon film 25 is doped with an impurity (phosphor), and the resistance of the film is reduced. Simultaneously, the impurity is diffused from the film 25 into the substrate 21, thereby forming a diffusion layer 26 in the surface of the substrate 21. A low-resistance film 27 having a thickness of about 2000Å and made of e.g. a metal having a high fusing point (Mo, MoSi$_x$, W, WSi$_x$, Ti, TiSi$_x$, etc.) is formed on the polysilicon film 25 by sputtering.

Thereafter, as is shown in FIG. 4D, the polysilicon film 25 and low-resistance film 27 are patterned by aelotropic etching and lithography technology, thus forming the gate electrode of a MOSFET constituting a flip-flop circuit, and wiring of the flip-flop circuit. That part of the silicon oxide film 23 which is exposed on the substrate 21 is removed using NH$_4$F solution.

Figure 4E:
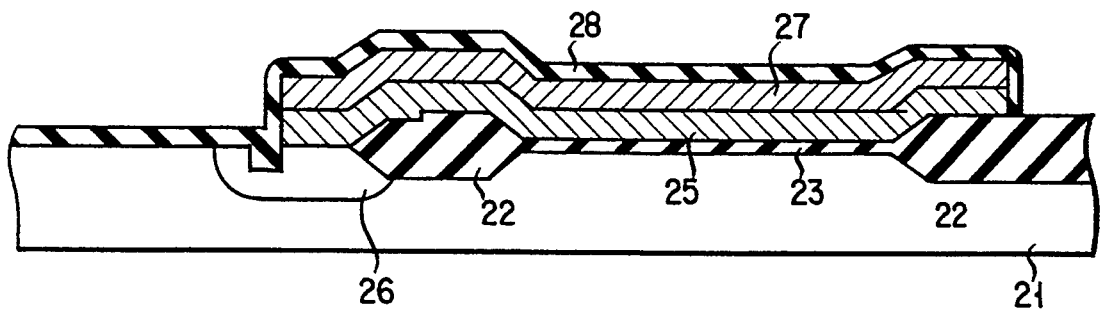

As is shown in FIG. 4E, a silicon oxide film (SiO$_2$) 28 having a thickness of about 250Å is formed on the substrate 21, polysilicon film 25, and low-resistance film 27 by dry oxygen oxidation at a temperature of 900° C.

Figure 4F:
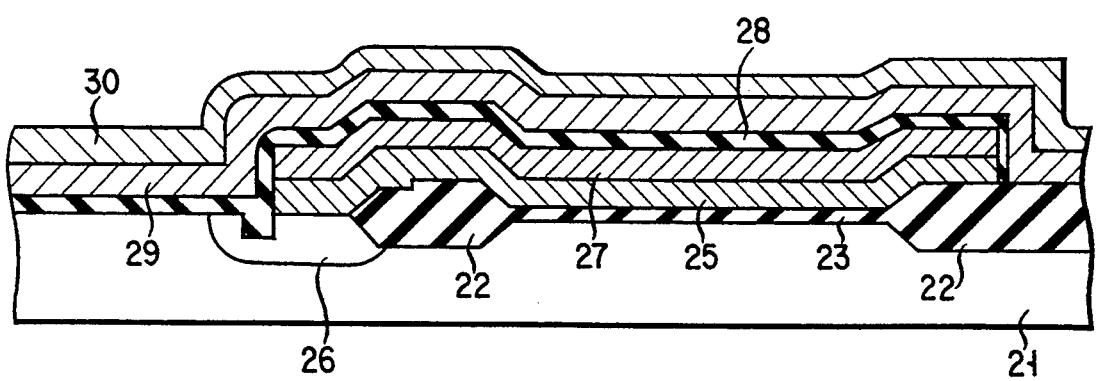

As is shown in FIG. 4F, a polysilicon film 29 having a thickness of about 2000Å is formed on the overall surface of the substrate 21 by chemical vapor deposition. Then, the resultant is subjected to heat treatment for 30 minutes in the atmosphere of POCl$_3$ of 900° C. As a result, the polysilicon film 29 is doped with an impurity (phosphor), and the resistance of the film is reduced. A low-resistance film 30 having a thickness of about 2000Å and made of e.g. a metal having a high fusing point (Mo, MoSi$_x$, W, WSi$_x$, Ti, TiSi$_x$, etc.) is formed on the polysilicon film 29 by sputtering.

Figure 4G:
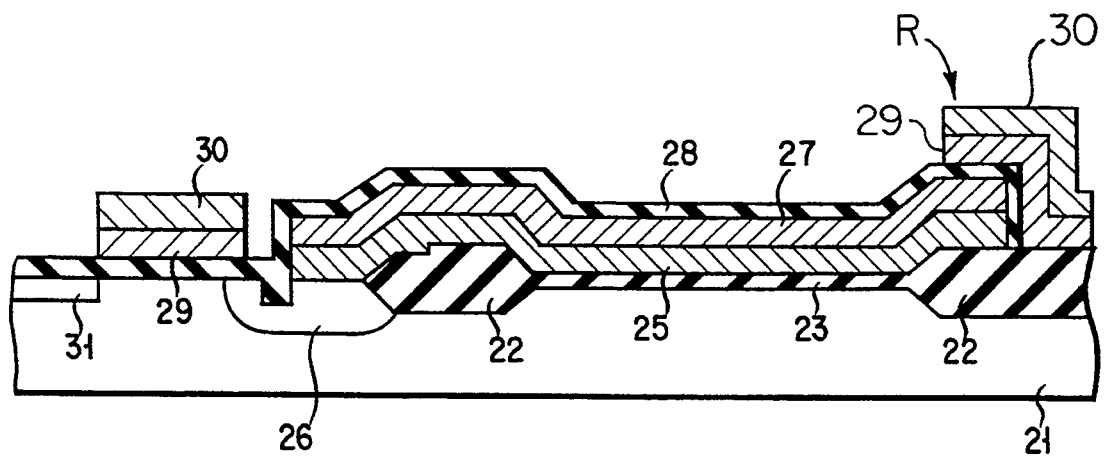

Thereafter, as is shown in FIG. 4G, the polysilicon film 29 and low-resistance film 30 are patterned by aelotropic etching and lithography technology, thus forming the gate electrode and signal wiring of the MOSFET for control of reading and writing memory cell data. The aelotropic etching is performed when the ratio of an etched portion of the silicon oxide film 28 or polysilicon film 29 to a non-etched portion of the same is large. Thereafter, approx. $5 \times 10^{15}$ cm$^{-2}$ of As ions are injected into the substrate 21 by applying an acceleration voltage of about 60 key thereto, with the gate electrode and signal wiring of the MOSFET used as a mask. Then, a diffusion layer (serving as a source or drain) 31 is formed in the substrate 21 by activating the injected As ions with heat.

Though the process onward is not shown, an interlayer insulating film A is formed on the overall surface of the substrate, then forming a contact hole in a predetermined portion of the film A, and forming a signal wire layer on the interlayer insulating film A. Further, an interlayer insulating film B is formed on the overall surface of the resultant, and then flattened. Thereafter, a contact hole is formed in the film B, and a metal wiring layer (made of e.g. an Al—Si alloy) is provided thereon.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device having a flip-flop circuit used as a memory cell in a static RAM, and a transfer gate for control of reading and writing data out of and into the memory cell, respectively, comprising:
   a flip-flop circuit having a first MOSFET with a gate electrode having first and second end portions, the gate electrode being formed by a layer of a first level;
   a transfer gate having a second MOSFET with a gate electrode formed by a layer of a second level different from the first level, one of the first and second end portions of the gate electrode of the first MOSFET being overlapped with the gate electrode of the second MOSFET;
   the flip-flop circuit having a third MOSFET with a gate electrode with first and second end portions, the gate electrode being formed by a layer of the first level;
   the transfer gate having a fourth MOSFET with a gate electrode formed by a layer of the second level, one of the first and second end portions of the gate electrode of the third MOSFET being overlapped with the gate electrode of the fourth MOSFET;
   the first, second, third and fourth MOSFETS each having a diffusion layer; and
   the other end portion of the gate electrode of the first MOSFET connected to diffusion layers of the third and fourth MOSFETs, and the other end portion of the gate electrode of the third MOSFET connected to diffusion layers of the first and second MOSFETs.

2. The semiconductor device according to claim 1, wherein a gate insulating film of the first MOSFET has a thickness different from that of the second MOSFET, and the ratio of the gate capacitance of the first MOSFET to that of the second MOSFET is determined by the ratio of the thickness of the gate insulating film of the first MOSFET to that of a gate insulating film of the second MOSFET.

3. The semiconductor device according to claim 2, wherein the first MOSFET has a unit-area gate capacitance larger than the second MOSFET.

4. The semiconductor device according to claim 2, wherein the gate insulating film of the first MOSFET is made of a material different from that of the gate insulating film of the second MOSFET.

5. The semiconductor device according to claim 1, wherein the gate electrode of the first MOSFET is formed by one of a laminated film consisting of a polysilicon film and a high-fusing-point metal film, and a laminated film consisting of a polysilicon film and a high-fusing-point metal silicide film.

6. The semiconductor device according to claim 1, wherein the gate electrode of the second MOSFET is formed by one of a laminated film consisting of a polysilicon film and a high-fusing-point metal film, and a laminated film consisting of a polysilicon film and a high-fusing-point metal silicide film.

7. The semiconductor device according to claim 1, wherein a gate insulating film of the first MOSFET is formed by one of a $SiO_2$ film, a SiN film, a TaO film, a composite film consisting of a $SiO_2$ film, a SiN film, and a $SiO_2$ film.

8. The semiconductor device according to claim 1, wherein a gate insulating film of the second MOSFET is formed by one of a $SiO_2$ film, a SiN film, a TaO film, a composite film consisting of a $SiO_2$ film, a SiN film, and a $SiO_2$ film.

9. The semiconductor device according to claim 1, wherein the first to fourth MOSFETS are arranged symmetrically with to a certain point.

* * * * *